United States Patent
Davidson et al.

(10) Patent No.: US 7,245,154 B1
(45) Date of Patent: Jul. 17, 2007

(54) DIFFERENTIAL INPUT RECEIVER WITH PROGRAMMABLE FAILSAFE

(75) Inventors: Allan T. Davidson, San Jose, CA (US); Jinghui Zhu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 141 days.

(21) Appl. No.: 11/071,356

(22) Filed: Mar. 3, 2005

(51) Int. Cl.
*H03K 19/0175* (2006.01)
(52) U.S. Cl. .......................... 326/82; 326/30
(58) Field of Classification Search ............ 326/82–83, 326/86, 30, 37; 327/108, 109
See application file for complete search history.

(56) References Cited

U.S. PATENT DOCUMENTS 5,781,028 A * 7/1998 Decuir .......................... 326/30
6,188,271 B1 * 2/2001 Wang et al. .................. 327/545
6,963,219 B1 * 11/2005 Ghia et al. .................... 326/30

OTHER PUBLICATIONS

National Semiconductor Corporation AN200184, Failsafe Biasing of LVDS Interfaces, Dec. 2001, pp. 1-4.
National Semiconductor, LVDS Owner's Manual, Low-Voltage Differential Signaling, 3rd Edition, Spring 2004, pp. 4-10-4-12, no month.
Fairchild Semiconductor, How to Apply SERDES Performance to Your Design, Edmond H. Suckow and Fairchild Semiconductor, 2003, pp. 1-18, no month.

* cited by examiner

*Primary Examiner*—James H. Cho
(74) *Attorney, Agent, or Firm*—MacPherson Kwok Chen & Heid LLP; Jonathan W. Hallman

(57) ABSTRACT

In one embodiment, a circuit is provided that includes: a differential input receiver having a first input terminal and a second input terminal; a first programmable switch coupled to the first input terminal and coupled through a first resistor to a first voltage such that if the first programmable switch is closed, the first input terminal is pulled towards the first voltage; and a second programmable switch coupled to the second input terminal and coupled through a second resistor to a second voltage such that if the second programmable switch is closed, the second input terminal is pulled towards the second voltage, wherein the first and second programmable switches are programmed to be closed during a differential input mode of operation in which the differential input receiver processes differential input signals provided to the first and second input terminals.

19 Claims, 2 Drawing Sheets

DIFFERENTIAL INPUT RECEIVER WITH PROGRAMMABLE FAILSAFE

TECHNICAL FIELD

The present invention relates generally to electronic circuits, and more particularly to a differential input receiver.

BACKGROUND

Electronic devices such as programmable logic devices include input/output (I/O) circuits to interface with external devices. Many I/O standards exist for such circuits. One particular class of I/O standards involves the use of differential signaling to achieve enhanced noise rejection. For example, a differential input receiver determines the state of an input signal by comparing the difference between two differential input signals, which may be differential in either current or voltage. A conventional differential input receiver 100 is illustrated in FIG. 1. If the input pins are left floating, i.e., not driven with input signals, the output of receiver 100 is generally in an unknown state. Because receiver 100 is very sensitive to small differences in potential (or current, depending upon whether receiver 100 is designed to respond to voltage or current differences), a relatively small amount of noise present on the input pins will cause receiver 100 to drive its output into either a logic high state or a logic low state. Alternatively, receiver 100 may drive its output to oscillate between the two logic states.

Because unpredictable logic states and potential oscillations should be avoided in digital systems, failsafe biasing techniques have been developed for differential I/O circuits. For example, a conventional failsafe-biased differential input receiver 200 is illustrated in FIG. 2. Receiver 200 has input pins that couple to nodes on a circuit board 205. For example, a first input pin 210 couples to a node 215 whereas a second input pin 220 couples to a node 225. Thus, the potentials of pins 210 and 220 are tied to the potentials of nodes 215 and 225, respectively. To prevent pins 210 and 220 from floating, a weak pull-up resister R1 weakly pulls a potential of node 215 towards VCC. Similarly, a weak pull-down resister R2 weakly pulls a potential of node 225 towards ground. Because of the relative weakness of resistors R1 and R2, receiver 200 may still respond to differential input signals driven onto pins 210 and 220. However, when these pins float, receiver 200 will respond to the weak pull up and pull down of nodes 215 and 225 by driving its output into a known logic high state. A termination resistor RT may be present across nodes 215 and 225 to, for example, match an input impedance on pins 210 and 220 to a characteristic impedance on input traces (not illustrated) on circuit board 205. The combined impedance of the R1, R2, RT resistor network is thus given by RT || (R1+R2) (RT in parallel with (R1+R2)). Assuming that the resistance for R1 and R2 is much larger than that of RT, then R1 and R2 have a negligible effect on the line termination. The resistance of RT may be adjusted as necessary to provide a desired input impedance.

Although the failsafe biasing of receiver 200 provides a known output state, a user has no way of altering this state. For example, during design of circuit board 205, design errors may occur such that input traces may need to be swapped to maintain the output of receiver 200 in a desired logical state while the input pins float. Accordingly, there is a need in the art for improved failsafe-biased differential input receiver designs.

SUMMARY

In one embodiment of the invention, a circuit includes: a differential input receiver having a first input terminal and a second input terminal; a first programmable switch coupled to the first input terminal and coupled through a first resistor to a first voltage such that if the first programmable switch is closed, the first input terminal is pulled towards the first voltage; and a second programmable switch coupled to the second input terminal and coupled through a second resistor to a second voltage such that if the second programmable switch is closed, the second input terminal is pulled towards the second voltage, wherein the first and second programmable switches are programmed to be closed during a differential input mode of operation in which the differential input receiver processes differential input signals provided to the first and second input terminals.

In another embodiment of the invention, a method of biasing a differential input receiver having a first input terminal and a second input terminal includes the acts of: closing a first switch to couple the first input terminal to a first signal source; closing a second switch to couple the second input terminal to a second signal source; and while the first and second switches are closed, operating the differential input receiver in the absence of differential input signals driving the first and second input terminals, wherein the differential input receiver is biased into a known logical state determined by the first and second signal sources.

In another embodiment of the invention, a programmable circuit includes a differential input receiver having a first input terminal and a second input terminal, wherein the programmable circuit includes a differential input mode of operation in which the differential input receiver processes differential input signals provided to the first and second input terminals; a first means having a first state for programmably driving a potential of the first input terminal of the receiver towards a power supply voltage; and a second means having a first state for programmably driving a potential of the second input terminal of the receiver towards ground, wherein, while the programmable circuit is in the differential input mode of operation, the first and second means are in the first state.

DETAILED DESCRIPTION

Figure 3:
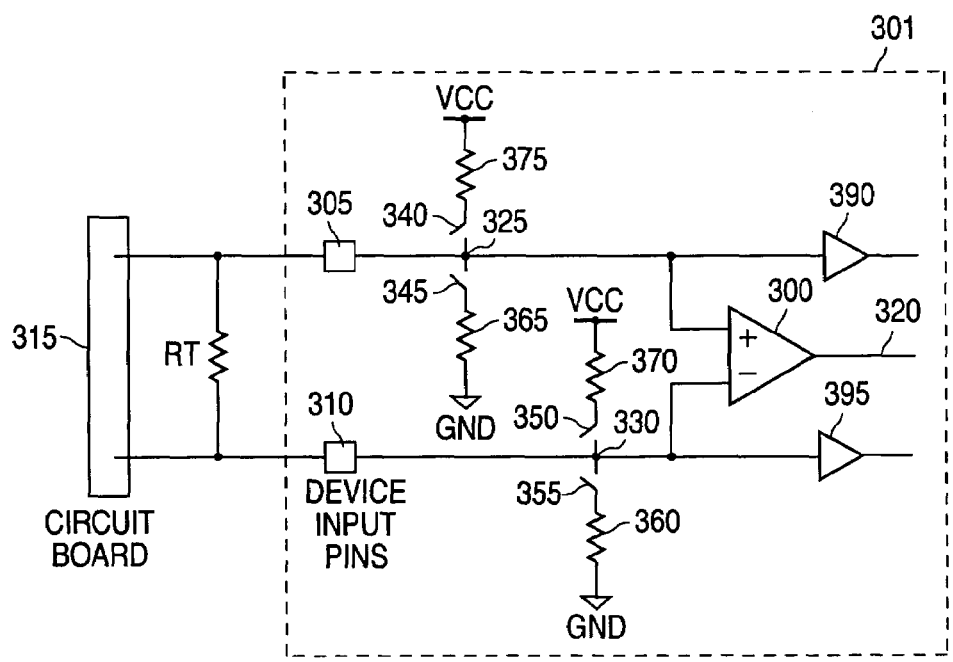
FIG. 3 is a schematic illustration of a programmable failsafe-biased differential input receiver according to an embodiment of the invention.

An exemplary embodiment of a programmable failsafe-biased differential 2 input receiver 300 is illustrated in FIG. 3. Differential input receiver 300 may be configured to implement a number of differential signaling protocols such as low voltage differential signaling (LVDS), low voltage positive emitter coupled logic (LVPECL), differential current mode logic (CML), or HyperTransport protocols.

In this embodiment, differential input receiver 300 is integrated within an integrated circuit 301 having input terminals such as pins or pads 305 and 310 connected to a circuit board 315. Differential input receiver 300 receives differential input signals through pins 305 and 310 and processes them to form an output signal 320. For example, if the differential input signals drive a potential of an input node 325 higher than a potential of an input node 330, differential input receiver 300 drives output signal 320 into a logical high state. Conversely, should the differential input signals drive the potential of input node 330 higher than the potential of input node 325, differential input receiver 300 drives output signal 320 into a logical low state.

It is conventional to provide users with multiple input/output protocols for the use of pins such as pins 305 and 310. For example, rather than use these pins in a differential signaling protocol with differential input receiver 300, each pin 305 or 310 may also be used in a single-ended signaling protocol. In a single-ended mode of operation, signals transmitted through pins 305 and 310 may be buffered through input buffers 390 and 395, respectively. To bias input buffers 390 and 395 during inactive modes of operation in which pins 305 and 310 are not used to carry input signals, programmable switches 340, 345, 350, and 355 may be used. For example, should a user desire input buffers 390 and 395 to be biased with a ground potential, programmable switches 345 and 355 are closed while switches 340 and 350 are kept open. In this fashion, nodes 325 and 330 are weakly pulled towards ground through weak pull-down resistors 365 and 360, respectively. Because nodes 325 and 330 provide the input voltages to buffers 390 and 395, respectively, these buffers are biased as desired. Conversely, should a user desire input buffers 390 and 395 to be biased with a power supply voltage, programmable switches 340 and 350 are closed and switches 345 and 355 opened. Nodes 325 and 330 are then weakly pulled towards a first signal source such as VCC through weak pull-up resistors 375 and 370, respectively, such that input buffers 390 and 395 are again biased as desired. It may be seen that switch pairs 340/345 and 350/355 are typically used in a parallel fashion—i.e., if switch pair 340/345 is configured to weakly bias input buffer 390 towards a second signal source such as ground, then switch pair 350/355 will be configured to bias input buffer 395 in the same fashion. Conversely, should switch pair 350/355 be configured to bias input buffer 395 weakly towards VCC, switch pair 340/345 will be configured to bias input buffer 390 in the same manner.

Figure 1:
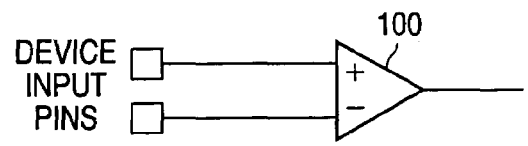
FIG. 1 is a schematic illustration of a conventional differential input receiver without failsafe biasing.
Figure 2:
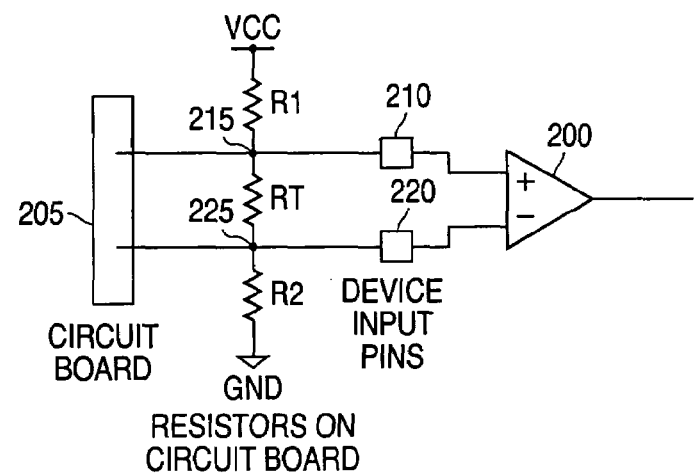
FIG. 2 is a schematic illustration of a conventional failsafe-biased differential input receiver.

When pins 305 and 310 are used in a differential signaling mode of operation, input buffers 390 and 395 are no longer used. However, the use of programmable switches 340, 345, 350, and 355 has been conventional only with the biasing of input buffers 390 and 395 associated with a single-ended signaling mode of operation. In a differential signaling mode, these switches were not used. However, should input nodes 325 and 330 simply float rather than be driven with differential input signals, the logical state of output signal 320 may become unpredictable as explained above with reference to FIG. 1.

Figure 4:
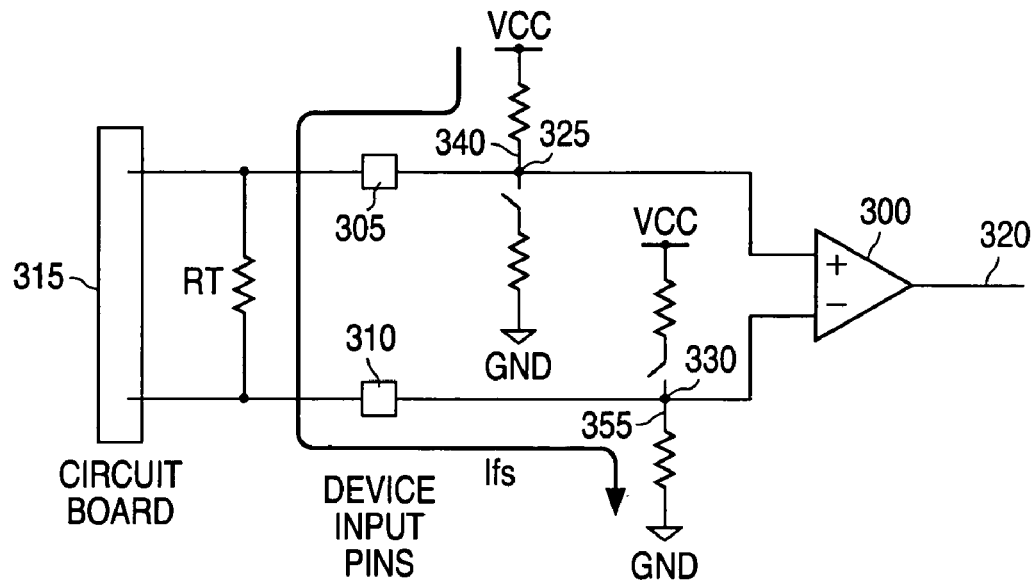
FIG. 4 is a schematic illustration of the receiver of FIG. 3 adapted to drive its output into a logical high state.

To avoid this unpredictability, a new use of programmable switches 340, 345, 350, and 355 is described herein to provide a novel programmable failsafe biasing architecture. In this programmable architecture, a user may specify what logical state output signal 320 should be driven to in an inactive mode of operation. An inactive mode of operation is defined by the lack of differential input signals driving pins 305 and 310 such that the potentials of input nodes 325 and 330 float. In one embodiment, programmable failsafe biasing is implemented through the use of switches 340, 345, 350, and 355. As discussed previously, power supply voltage VCC couples to switch 340 through weak pull-up resistor 375. Conversely, ground potential couples to switch 355 through weak pull-down resistor 360. Thus, should switches 340 and 355 be closed as shown in FIG. 4, input node 325 will be pulled weakly towards VCC whereas input node 330 will be pulled weakly towards ground. Because these nodes are merely weakly pulled in potential, the normal operation of differential input receiver with respect to the processing of differential input signals is not affected. However, in the inactive mode of operation when no differential input signals are being received at input pins 305 and 310, the weak pull up of input node 325 and the weak pull down of input node 330 causes differential input receiver 300 to drive output signal 320 into the logical high state. Thus, by closing switches 340 and 355, a user may be assured that output signal 320 is driven into a logical high state in an inactive mode of operation. A termination resistor RT may be coupled between input pins 305 and 310 to provide impedance matching as discussed earlier. Should resistor RT be present, a current Ifs will flow through resistor RT when switches 340 and 355 are closed as shown in FIG. 4.

In contrast to the conventional use of programmable switch pairs 340/345 and 350/355 with respect to biasing input buffers 390 and 395, these pairs are used in a complementary fashion to failsafe bias differential input receiver 300. For example, if switch 340 in switch pair 340/345 is closed, the corresponding switch (350) in switch pair 350/355 is opened. Similarly, if switch 345 is opened, the corresponding switch (355) in switch pair 350/355 is closed. In this fashion, the potentials of nodes 325 and 330 are pulled in a corresponding complementary or opposing manner.

Figure 5:
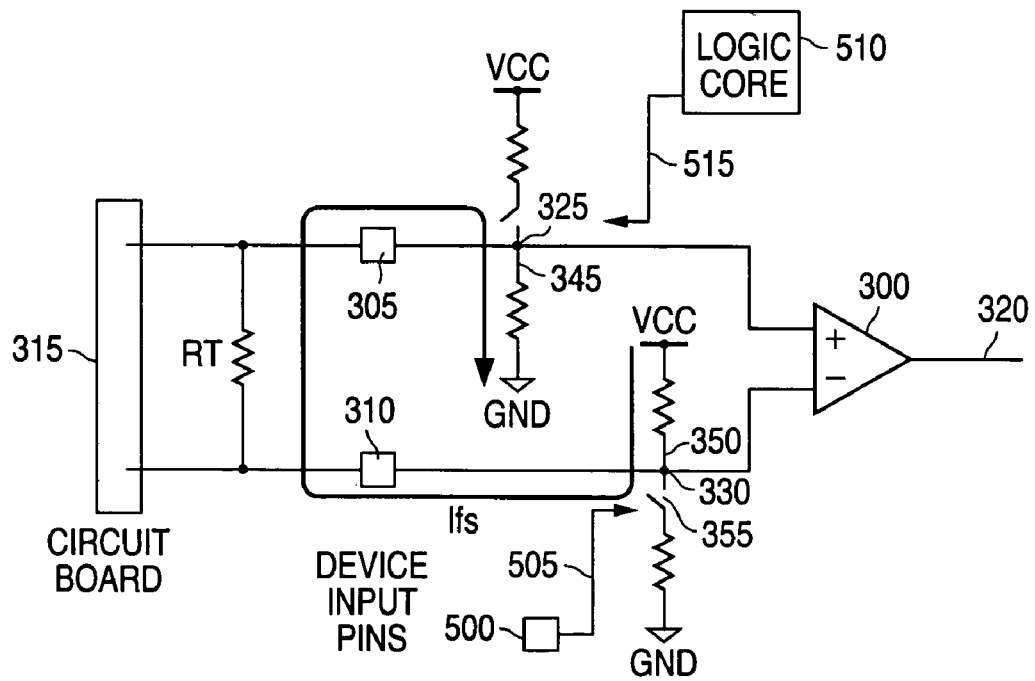
FIG. 5 is a schematic illustration of the receiver of FIG. 3 adapted to drive its output into a logical low state. Use of the same reference symbols in different figures indicates similar or identical items.

Referring again to FIG. 3, switch 345 couples to ground through weak pull-down resistor 365 as discussed previously. Conversely, switch 350 couples to VCC through a weak pull-up resistor 370. Thus, should switches 345 and 350 be closed while switches 340 and 355 are opened as shown in FIG. 5, node 325 will be weakly pulled towards ground whereas node 330 will be weakly pulled towards VCC. As discussed previously, because these nodes are merely weakly pulled in potential, the normal operation of differential input receiver with respect to the processing of differential input signals is not affected. However, in the inactive mode of operation when no differential input signals are being received at input pins 305 and 310, the weak pull-down of input node 325 and the weak pull-up of input node 330 causes differential input receiver 300 to drive output signal 320 into the logical low state. Thus, by closing switches 345 and 350, a user may be assured that output signal 320 is driven into a logical low state in the inactive mode of operation. A current Ifs will flow through resistor RT as shown in FIG. 5 in this mode should this resistor be present.

Switches 340, 345, 350, and 355 may be implemented in a number of ways such as with either field effect transistors (FETs) or bipolar junction transistors (BJTs). To provide the control signals for controlling the switches, integrated circuit 301 may include memory cells for storing the corresponding control signals. For example, as shown in FIG. 5, a memory cell 500 stores a control signal 505 that controls whether switch 355 is open or closed. Because switches 350 and 355 typically operate in a complementary fashion, control signal 505 may pass through an inverter (not illustrated) and thus also control switch 350. Similarly, switches 340 and 345 should also operate in a complementary fashion. In such an embodiment, each switch pair 340/345 and 350/355 need require only a single memory cell for storing the corresponding control signal. Should integrated circuit 301 be a programmable logic device, the corresponding memory cells could be cells within the programmable logic device's configuration memory. Thus, during configuration of the programmable logic device, a user would also program the desired state for output signal 320 during the inactive mode of operation. In an alternative embodiment, the switches may be driven by externally-provided signals.

A logic core 510 within integrated circuit 301 may also be used to generate the control signals for controlling the programmable switches. For example, logic core 510 may generate control signal 515 that controls whether switch 325 is open or closed. A similar control may be exerted over the remaining switches by logic core 510. The use of logic core 510 to control the programmable switches enables a self-healing mode of operation. For example, suppose the traces on circuit board 315 are scrambled through a design error such that the node carrying VCC instead carries ground and such that the node carrying ground instead carries VCC. It can be seen from inspection of FIGS. 4 and 5 that such a scrambling would lead to an inversion of the desired failsafe state for output 320. Logic core 510 could be configured to examine output 320 during failsafe operation and determine if the potential of output 320 is as was desired. If the potential of output 320 is not as was desired, logic core 510 could respond by generating the appropriate control signals to operate the programmable switches such that the output 320 has the desired potential. For example, with respect to FIG. 4, if the VCC and ground nodes are scrambled, output 320 would be pulled towards ground rather than towards VCC. Logic core 320 could sense this and respond by configuring the switches as discussed with respect to FIG. 5 such that the output node would be pulled towards VCC rather than ground.

The above-described embodiments of the present invention are merely meant to be illustrative and not limiting. It will thus be obvious to those skilled in the art that various changes and modifications may be made without departing from this invention in its broader aspects. For example, although the switches and pull-up/down resistors have been described as being incorporated into the integrated circuit including the corresponding differential input receiver, these switches and resistors may be external to this circuit. Accordingly, the appended claims encompass all such changes and modifications as fall within the true spirit and scope of this invention.

We claim:

1. A circuit, comprising:
a differential input receiver having a first input terminal and a second input terminal;
a first programmable switch coupled to the first input terminal and coupled through a first resistor to a first voltage such that if the first programmable switch is closed, the first input terminal is pulled towards the first voltage;
a second programmable switch coupled to the second input terminal and coupled through a second resistor to a second voltage such that if the second programmable switch is closed, the second input terminal is pulled towards the second voltage;
a third programmable switch coupled to the first input terminal and coupled through a third resistor to the second voltage such that if the third programmable switch is closed, the first input terminal is pulled to the second voltage; and
a fourth programmable switch coupled to the second input terminal and coupled through a fourth resistor to the first voltage such that if the fourth switch is closed, the second input terminal is pulled towards the first voltage;
wherein the first and second programmable switches are programmed to be closed and the third and fourth programmable switches are programmed to be open during a first differential input mode of operation in which the differential input receiver processes differential input signals provided to the first and second input terminals.

2. The circuit of claim 1, wherein the first and second programmable switches are programmed to be open and the third and fourth programmable switches are programmed to be closed during a second differential input mode of operation in which the differential input receiver processes differential input signals provided to the first and second input terminals.

3. The circuit of claim 1, further comprising:
a first memory cell operable to store a first control signal for controlling the first programmable switch; the first memory cell being configured to provide the programming of the first programmable switch.

4. The circuit of claim 3, further comprising:
a second memory cell operable to store a second control signal for controlling the second programmable switch; the second memory cell being configured to provide the programming of the second programmable switch.

5. The circuit of claim 4, wherein the circuit is included within a programmable logic device and wherein the first and second memory cells are within a configuration memory for the programmable logic device.

6. The programmable logic device of claim 5, wherein the configuration memory is an internal memory of the programmable logic device.

7. The circuit of claim 1, wherein the first resistor is a weak pull-up resistor and wherein the second resistor is a weak pull-down resistor.

8. The circuit of claim 1, wherein a termination resistor couples across the first and second input terminals.

9. A method of biasing a differential input receiver having a first input terminal and a second input terminal, comprising:
closing a first switch from a first set of two switches coupled to the first input terminal to couple the first input terminal to a first signal source, a remaining switch in the first set of switches being coupled to the second signal source;
closing a second switch from a second set of two switches coupled to the second input terminal to couple the second input terminal to a second signal source, a remaining switch in the second set of switches being coupled to the first signal source; and
while the first and second switches are closed, operating the differential input receiver in the absence of differential input signals driving the first and second input terminals,
wherein the differential input receiver is biased into a known logical state determined by the first and second signal sources.

10. The method of claim 9, wherein the first and second signals sources are voltages.

11. The method of claim 10, wherein the first signal source is a supply voltage and the second signal source is ground.

12. The method of claim 9, wherein closing the first switch and closing the second switch includes programming memory cells that control the operation of the switches.

13. The method of claim 12, wherein the differential input receiver is integrated within a programmable logic device (PLD), the method including providing to the PLD a configuration bitstream that includes bits to program the memory cells.

14. The method of claim 9, wherein the differential input receiver is integrated within a programmable logic device having a logic core, the method further comprising:
   configuring the logic core to enable the closing of the first and second switches.

15. A programmable circuit including a differential input receiver having a first input terminal and a second input terminal, comprising:
   a first means having a first state for programmably driving a potential of the first input terminal of the receiver towards a power supply voltage and having a second state for programmably driving a potential of the first input terminal towards ground; and
   a second means having a first state for programmably driving a potential of the second input terminal of the receiver towards ground and having a second state for programmably driving a potential of the second input terminal towards the power supply voltage,
   wherein, while the programmable circuit is in a first differential input mode of operation, the first and second means are in the first state.

16. The programmable circuit of claim 15, wherein, while the programmable circuit is in a second differential input mode of operation, the first and second means are in the second state.

17. The programmable circuit of claim 15, wherein the programmable circuit is a programmable logic device.

18. The programmable logic device of claim 17, wherein a configuration memory for the programmable logic device is configured to provide control signals for controlling whether the first and second means are in the first state.

19. The programmable circuit of claim 15, wherein the differential input receiver is one of a low voltage differential signaling (LVDS) receiver and a low voltage positive emitter coupled logic (LVPECL) receiver.

* * * * *